(12) United States Patent
Ebel

(10) Patent No.: US 7,300,211 B2
(45) Date of Patent: Nov. 27, 2007

(54) DEVICE FOR SENDING OR RECEIVING OPTICAL SIGNALS

(75) Inventor: Norbert Ebel, Berlin (DE)

(73) Assignee: Mergeoptics GmbH, Berlin (DE)

( * ) Notice: Subject to any disclaimer, the term of this patent is extended or adjusted under 35 U.S.C. 154(b) by 138 days.

(21) Appl. No.: 10/667,139

(22) Filed: Sep. 17, 2003

(65) Prior Publication Data

US 2005/0058405 A1    Mar. 17, 2005

(51) Int. Cl.
*G02B 6/36* (2006.01)

(52) U.S. Cl. .............................. 385/88; 385/88; 385/89; 385/92; 385/94; 257/433

(58) Field of Classification Search ............. 385/88–92
See application file for complete search history.

(56) References Cited

U.S. PATENT DOCUMENTS

| 5,065,226 | A  | * | 11/1991 | Kluitmans et al. | ........... | 257/433 |
| 6,222,967 | B1 | * | 4/2001  | Amano et al.     | ............ | 385/49  |
| 6,422,766 | B1 | * | 7/2002  | Althaus et al.   | ............ | 385/94  |
| 2003/0059175 | A1 | * | 3/2003 | Bendelli et al. | ............ | 385/92  |
| 2003/0142929 | A1 | * | 7/2003 | Bartur et al.   | ............ | 385/92  |

FOREIGN PATENT DOCUMENTS

DE    34 09 146    9/1985

* cited by examiner

*Primary Examiner*—Frank G. Font
*Assistant Examiner*—Erin D. Chiem
(74) *Attorney, Agent, or Firm*—Alfred A. Fressola; Ware, Fressola, Van Der Sluys & Adolphson LLP

(57) ABSTRACT

A device for sending or receiving optical signals wherein an opto-electrical transducer (5), an associated glass fiber (8) and other elements (6, 7) of a sending or receiving circuit are arranged on a common support; namely, a circuit board (1) comprising different multiple layers of insulation material and intermediate layers of metal, with a recess (2) containing an opening (3) and a bottom (4) on which conducting tracks are located, where at least some of them are impedance-matched. The transducer (5) and the other elements (6, 7) are located entirely in the recess (2) and are connected to the conducting tracks. At least some of the conducting tracks protrude laterally from the recess (2) into the surrounding edge areas of the circuit board (1), where at least some are connected to impedance-matched conductors (11) which extend to a common surface inside the circuit board (1) and respectively end on a contact surface (12). The glass fiber (8) exits from the recess (2) through an opening in the circuit board (1).

14 Claims, 2 Drawing Sheets

DEVICE FOR SENDING OR RECEIVING OPTICAL SIGNALS

TECHNICAL FIELD

The invention concerns a device for sending or receiving optical signals, wherein an opto-electrical transducer, together with an associated glass fiber and other elements that are provided for a sending or receiving circuit, are arranged on a common support.

BACKGROUND OF THE INVENTION

Such a device (DE 34 09 146 A1) is required for example to transmit data via glass fibers or optical fibers. As a sender the opto-electrical transducer can be a laser diode for example to which a driver circuit is assigned. As a receiver it can be designed as a photo-diode for example which is connected to a transimpedance amplifier that operates as a preamplifier. Such devices are also used for high-rate data transmission starting for example at 10 Gigabytes. The electrical range of such devices in particular must ensure that the data or signals being transmitted are not distorted or become even unreadable. Interference can be caused for example by reflection from junctions in poorly or wrongly adjusted waveguides. The devices must additionally be protected against external electromagnetic fields and must not emit any electromagnetic stray radiation. They must furthermore be optically sealed and protected against humidity.

The above mentioned DE 34 09 146 A1 describes a device that is called an optoelectronic module in which at least one amplifier element is installed by means of integrated technology for example on a semiconductor substrate made of silicon. The substrate contains a depression in which a light modulator suitable for sending or receiving light is installed. It is cemented for example to the substrate inside the depression. A bonding wire connects the light modulator to an amplifier element of the substrate to provide the electrical conduction. The substrate itself is located on a plate from which electrically conducting connectors protrude to provide potential to the substrate. Such wires and connectors may have an interfering effect during rapid data transmission and can at least distort the signal. Furthermore the device is not protected against external electromagnetic fields. Nor is it optically sealed. The module comprising the plate and the substrate is installed in a housing with a glass fiber connection. There is no protection against humidity.

SUMMARY OF THE INVENTION

The object of the invention is to simplify the construction of the above described device and to design it so that it can operate without interference even at higher frequencies, and so that it can easily be combined with other switching elements.

The invention achieves this object in that:
the support is a circuit board comprising different multiple layers of insulation material and intermediate layers of metal, with a recess that contains an opening and a bottom on which conducting tracks are located and where at least some of them are impedance-matched,
the transducer and the other elements are entirely located in the recess without projecting from it, and are connected to the conducting tracks,
at least some of the conducting tracks lead laterally out of the recess to the edge area of the circuit board surrounding it, and at least some of them are connected to the impedance-matched conductors extending inside the circuit board to a common surface on it, where they respectively end in a contact surface,
the glass fiber exits from the recess through an opening in the circuit board, and
an electrically active shield is provided around the circuit board.

In this device the elements that are needed by an optical sender or receiver, including the glass fiber required to conduct optical signals, are combined in a single, compact and simple to handle component, namely the circuit board. The fully assembled circuit board can be functionally installed in a single operation step, for example on a circuit board module which forms part of a complete transmission system. To that end the face on which the contact surfaces are located only needs to be installed on a plate containing the corresponding matching contacts and connected thereto by soldering for example. The glass fiber is accurately positioned on the circuit board and can extend directly for example to an optical plug-and-socket connector. The connection of the conducting tracks to the impedance-matched conductors ensures the flawless operation of the electrical part of the device, even at the higher transmission rates of more than 10 Gigabytes for example. Since the entire device is furthermore surrounded by an electrical shield, it is effectively protected against external electromagnetic fields. Nor is the device able to emit electromagnetic stray radiation.

In a preferred version the impedance-matched conducting tracks in the bottom of the recess are microstrips. The impedance-matched conductors, which protrude through the layers of the circuit board, are preferably coaxial conductors or differential double conductor coaxial lines.

BRIEF DESCRIPTION OF THE DRAWINGS

An embodiment of the subject of the invention is illustrated by the drawings, where.

DETAILED DESCRIPTION

Figure 1:
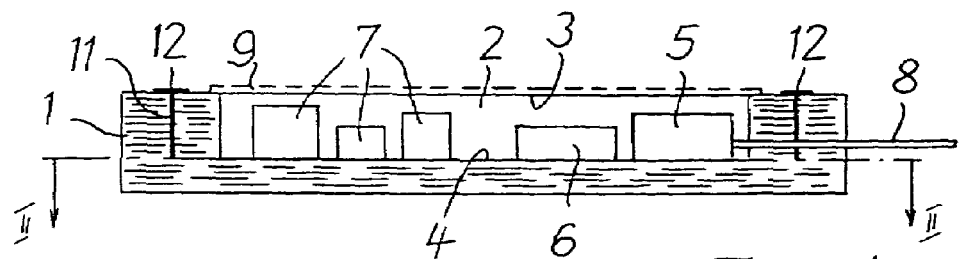
FIG. 1 is a general view of the device according to the invention in a schematically presented section.

FIG. 1 illustrates a section of a multi-layer circuit board 1. Such circuit boards comprise several layers, for example twelve, of insulation material between which intermediate layers of metal, particularly of copper, are placed. The intermediate layers can be designed as metal surfaces and/or conducting tracks. The material of the circuit board 1 is preferably suitable for high frequency applications. It can be filled to advantage with fluoro-ethylene-propylene (FEP or "Teflon") and a ceramic material. But ceramic materials or other insulating materials can also be used. The circuit board 1 has a recess 2 in its center, with an opening 3 and a bottom 4. The elements needed for the optical data transmission by a sender or a receiver are located in the recess 2. Since the construction of the device is basically the same for both applications, the following considers the sender but is also representative of the receiver.

For example a laser diode 5, a driver circuit 6 assigned to the latter and other peripheral elements 7 which are required for the optical data transmission by a sender are installed in the recess 2. All mentioned elements are preferably constructed with the usual semiconductor technology. They are entirely located in the recess 2 and therefore do not protrude from its edge, thus not through the opening 3. A glass fiber 8 passes through the wall of the circuit board 1 and is accurately positioned with respect to the laser diode 5. In the finished device the opening 3 is preferably closed by a metal plate 9. The plate 9 is shown by broken lines in FIG. 1.

The sunken arrangement of the mentioned sender elements in the recess 2, which is bordered all around by the circuit board 1, and its covering by the plate 9 provides an optical seal for the elements in the circuit board 1, and protects them against humidity.

Figure 2:
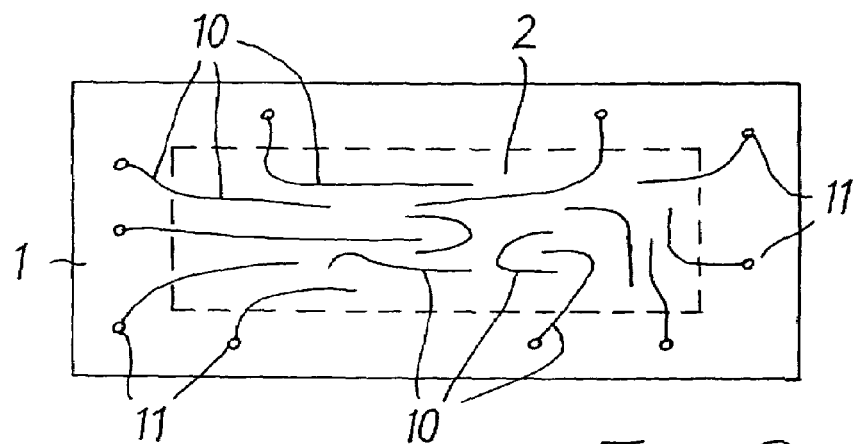
FIG. 2 is a cut through FIG. 1 along line II-II.

Conducting tracks 10, which are at least impedance-matched for the high-frequency signal paths, are located on the bottom 4 of the recess 2 where they provide the electrical connection and interconnect the described elements of the sender. These conducting tracks 10 are designed as impedance-matched waveguides, preferably as accurately reproducible microstrips. As shown in FIG. 2, the conducting tracks 10 exit laterally from the recess 2, whose edges are drawn by broken lines, to the edge areas of the circuit board 1 surrounding it. There said conducting tracks 10 are connected to the conductors 11 which are located inside the circuit board 1 and protrude from one of its surfaces. The conducting tracks 10 that do not exit from the recess 2 are used to interconnect the elements of the device.

Figure 3:
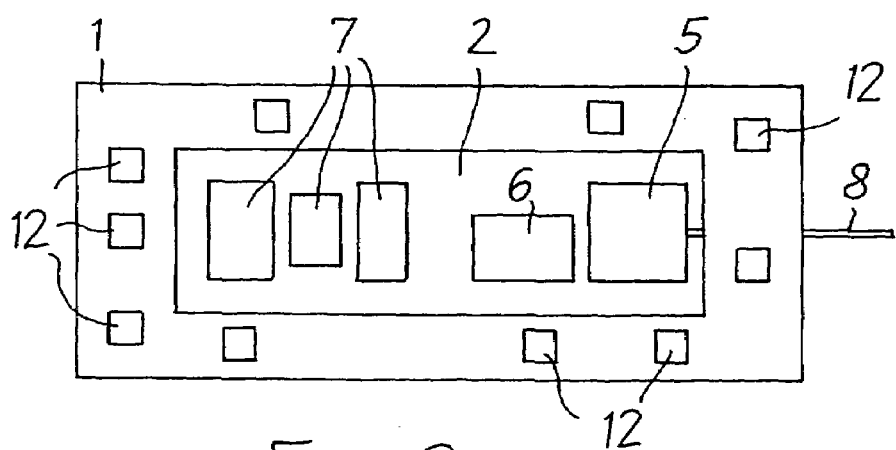
FIG. 3 is a top view of the device in FIG. 1.

The impedance-matched conducting tracks 10 are connected in a reflection-free manner to impedance-matched conductors 11. Each conductor 11 ends on a contact surface 12 on the circuit board 1. The contact surfaces 12 are permanently attached to the circuit board 1. In a preferred version they are all located on the same surface of the circuit board 1. This is preferably the surface of the circuit board 1 in which the opening 3 of the recess 2 is located. The contact surfaces 12 and thus the conductors 11 as well can then be distributed around the recess 2 as shown in FIG. 3.

Figure 4:
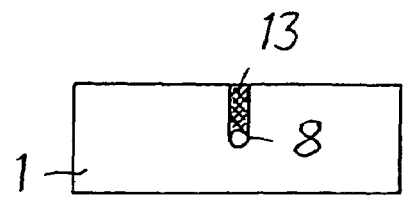
FIG. 4 is a front view of the device in FIG. 1.

As shown in FIG. 4 the glass fiber 8 can be placed in a groove 13 in the wall of the circuit board 1, which is hermetically sealed and conducts electricity after the glass fiber 8 has been installed. It is however also possible to guide the glass fiber 8 through a hole in the wall of the circuit board 1 to the recess 2, which is also hermetically sealed and conducts electricity.

Figure 5:
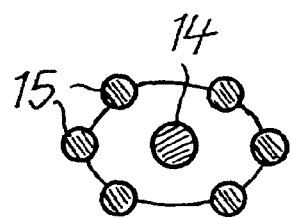
FIGS. 5 to 7 are enlarged sections of the device in FIG. 1.
Figure 6:
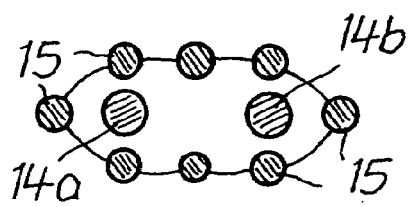

In the preferred version the conductors 11 are designed as impedance-matched, coaxial lines as shown in FIG. 5. Such a line comprises an inner conductor 14, and feedthrough contacts 15 which are connected to ground and are arranged concentrically around the inner conductor 14 and with a clearance between each other. They form an impedance-matched waveguide in conjunction with the metallic intermediate layers inside the circuit board 1. This also applies to the version of the conductors 11 which can be used to advantage as a differential double conductor line in a coaxial form. In this case the feedthrough contacts 15 enclose two internal conductors 14a and 14b (see FIG. 6). The internal conductors 14, 14a and 14b are always insulated from the metallic intermediate layers of the circuit board 1.

Figure 7:
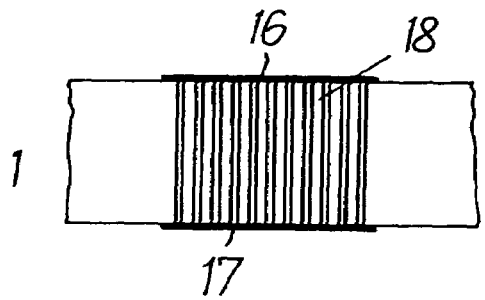

Metallic surfaces 16 can be provided on the bottom 4 of recess 2, on which heat producing sender elements can be installed. They are used to remove the heat and pass through the wall of the circuit board 1 to one of its free surfaces, as shown in FIG. 7. To shorten this feedthrough, a sink can be installed on the bottom 4 of recess 2 in which the metallic surfaces 16 are located and the heat producing elements are installed. The metallic surface 17 provided on the corresponding free surface of the circuit board 1 conducts the heat away. An additional cooling device can also be installed there. The surfaces 16 and 17 and their heat-conducting connection can be realized with a number of feedthrough contacts 18 as indicated in FIG. 7. However metal blocks can also be installed in the wall of circuit board 1.

The circuit board 1 is surrounded by an electrically active shield to protect the sender against electromagnetic fields. It is thus unable to produce any stray radiation by itself. To that end the circuit board 1 can be coated all over with an electrically conductive material such as copper, while all the contact surfaces 12 are left uncoated. But sealed feedthrough contacts can also be placed around the outer area of the circuit board 1 to form a common housing potential.

Figure 8:
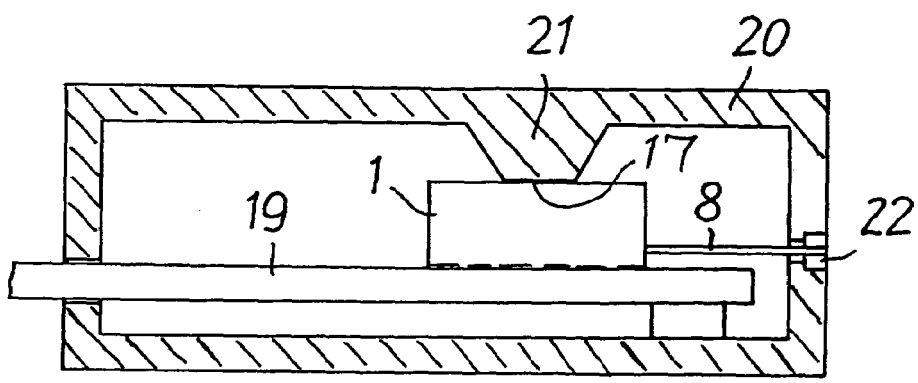
FIG. 8 is a superimposed system with a device according to the invention.

As already mentioned, all the contact surfaces 12 of the completed device are located on a common surface of the circuit board 1. To install the device it only needs to be located so that its contact surfaces 12 touch the respective opposite contacts on the circuit board 19 of a superimposed transmission system and make electrical contact with them, for example by soldering or by means of a contact mat. As shown in FIG. 8, the circuit board 19 can be installed for example in a metallic housing 20 which is inserted as a transceiver in a transmission system. The housing 20 can have an inward facing projection 21 which when installed touches the surface 17 provided for removing heat from the circuit board 1. The glass fiber 8 can end in an externally accessible plug-and-socket connector 22 in the wall of the housing 20.

The invention claimed is:

1. A device for sending or receiving optical signals comprising:

an opto-electrical transducer, an associated glass fiber, and a common support, on which said opto-electrical transducer and associated glass fiber are arranged; wherein the support is a circuit board (1) comprising different multiple layers of insulation material and intermediate layers of metal, with an integral recess (2) formed therein containing an opening (3) and a bottom (4) on which conducting tracks (10) are installed and at least some of the conducting tracks are impedance-matched, the transducer is entirely located in the recess (2) without projecting from the recess, and is connected to the conducting tracks (10), at least some of the conducting tracks (10) protrude laterally from the recess (2) to the surrounding edge areas of the circuit board (1), where at least some of said tracks are connected to impedance-matched conductors (11) that extend to a common surface on the inside of the circuit board (1) where said tracks respectively end on a contact surface (12), the glass fiber (8) exits from the recess (2) through an opening in the circuit board (1), an electrically active shield is installed around the circuit board (1); and said impedance-matched conductors (11) are respectively designed as coaxial lines with an internal conductor (14) that is connected in a reflection-free manner to the impedance-matched conducting tracks (10), and with a plurality of feedthrough contacts (15) that are arranged concentrically around the internal conductor (14) and have clearance with respect to each other, which are interconnected to conduct electricity at least at one point, and are connected to ground.

2. A device as claimed in claim 1, characterized in that the conducting tracks (10) used to conduct high-frequency signals are designed as impedance-matched waveguides, in particular as microstrips.

3. A device as claimed in claim 2, characterized in that the opening (3) of the recess (2) is closed by a plate (9).

4. A device as claimed in claim 3, characterized in that the plate (9) is made of metal.

5. A device as claimed in claim 4, characterized in that the contact surfaces (12) of the conductors (11) are installed on the surface of the circuit board (1) in which the opening (3) of the recess (2) is located.

6. A device as claimed in claim 5, characterized in that the contact surfaces are distributed around the recess (2).

7. A device as claimed in claim 1, characterized in that the opening (3) of the recess (2) is closed by a plate (9).

8. A device as claimed in claim 7, characterized in that the plate (9) is made of metal.

9. A device as claimed in claim 1, characterized in that the contact surfaces (12) of the conductors (11) are installed on the surface of the circuit board (1) in which the opening (3) of the recess (2) is located.

10. A device as claimed in claim 9, characterized in that the contact surfaces are distributed around the recess (2).

11. A device as claimed in claim 1, characterized in that first metallic surfaces (16) are located on the bottom of the recess (2), on which heat producing elements are installed and are connected in a heat-conducting manner to second metallic surfaces (17) located on an open surface of the circuit board (1).

12. A device for sending or receiving optical signals comprising:
    an opto-electrical transducer;
    a glass fiber associated with said opto-electrical transducer;
    a circuit board having multiple layers of insulation material and intermediate layers of metal with an integral recess formed therein containing an opening and a bottom on which conducting tracks are installed, wherein at least some of the conducting tracks are impedance-matched; and
    an electrically active shield installed around the circuit board;
    wherein the opto-electrical transducer is located entirely within the integral recess without projecting from the recess and is connected to the conducting tracks;
    wherein at least some of the conducting tracks protrude laterally from the recess to the surrounding edge areas of the circuit board where at least some of the conducting tracks connect to impedance-matched conductors that extend to a common surface on the inside of the circuit board where they respectively end on a contact surface;
    wherein the impedance-matched conductors are coaxial lines with an internal conductor that is connected in a reflection-free manner to the impedance-matched conducting tracks, and with a plurality of feedthrough contacts arranged concentrically around the internal conductor with clearance with respect to each other and interconnected to conduct electricity at least at one point;
    wherein the end of each impedance-matched conductor is positioned on the contact surface so as to be connectable to contacts on a circuit board, and
    wherein the glass fiber exits from the recess through an opening in the circuit board and an electrically active shield around the circuit board.

13. A device as claimed in claim 12, further comprising peripheral elements in cooperative engagement with the opto-electrical transducer and further positioned on the conducting tracks so that the opto-electrical transducer and peripheral elements are positioned relative to each other in a planar configuration.

14. A device as claimed in claim 12, further comprising first metallic surfaces located on the bottom of the recess, on which the opto-electrical transducer is located, said first metallic surfaces in thermal contact with second metallic surfaces located on an open surface of the circuit board.

* * * * *